(12) United States Patent
    Vogan

(10) Patent No.: US 8,705,281 B2
(45) Date of Patent: Apr. 22, 2014

(54) METHOD AND SYSTEM TO ISOLATE MEMORY MODULES IN A SOLID STATE DRIVE

(75) Inventor: Andrew W. Vogan, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 335 days.

(21) Appl. No.: 12/755,220

(22) Filed: Apr. 6, 2010

(65) Prior Publication Data
    US 2011/0242894 A1    Oct. 6, 2011

(51) Int. Cl.
    *G11C 11/34* (2006.01)
(52) U.S. Cl.
    USPC ................................................. 365/185.18
(58) Field of Classification Search
    USPC ................................................. 365/185.18
    See application file for complete search history.

(56) References Cited

U.S. PATENT DOCUMENTS

| | | | |
|---|---|---|---|
| 5,946,257 A * | 8/1999 | Keeth | 365/226 |
| 7,477,545 B2 * | 1/2009 | Tu et al. | 365/185.05 |
| 2009/0207663 A1 * | 8/2009 | Kang | 365/185.18 |
| 2010/0037003 A1 * | 2/2010 | Chen et al. | 711/103 |

OTHER PUBLICATIONS

"Open NAND Flash Interface Specification", Amber Huffman (editor), Revision 2.2, 216 pages, Oct. 7, 2009.

* cited by examiner

*Primary Examiner* — Hoai V Ho
*Assistant Examiner* — Pablo Huerta
(74) *Attorney, Agent, or Firm* — Konrad Raynes Davda & Victor LLP; David W. Victor

(57) ABSTRACT

A method and system to facilitate the usage of memory modules that have one or more defective memory dies. In one embodiment of the invention, a memory module is packaged with a number of dies and the memory module is tested and sorted according to the number of dies that pass testing. Each signal of each die in the memory module has an unique bond-out or connection point in the package of the memory module. By separating the signals of each die in the memory module, any defective die can be easily isolated and this allows a significant cost reduction in products that use a large number of dies.

11 Claims, 3 Drawing Sheets

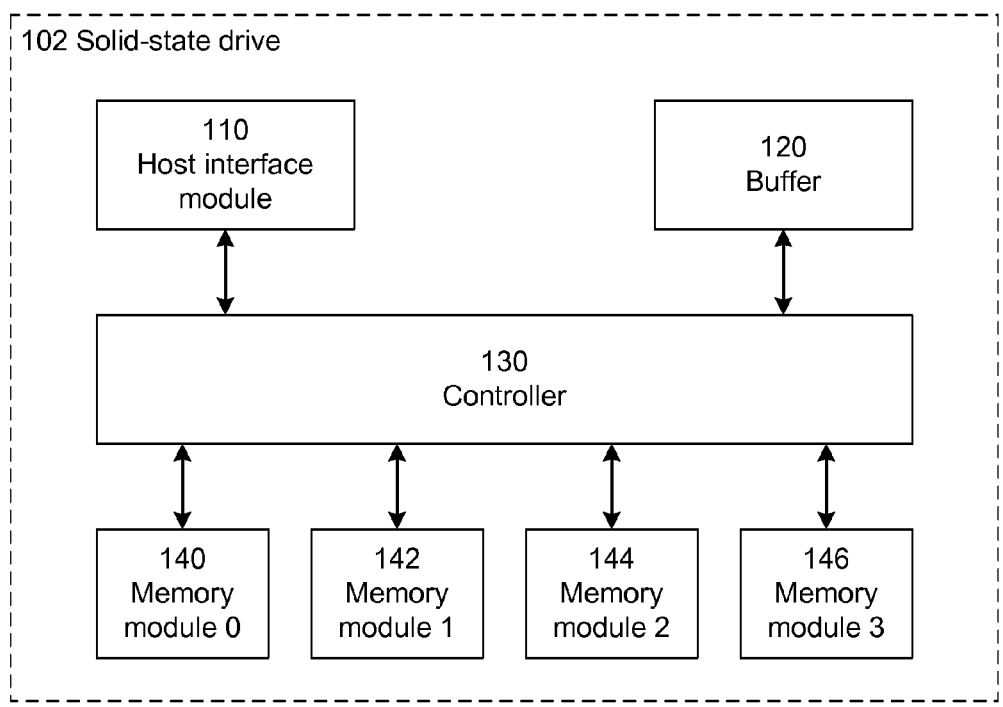
100          FIG. 1
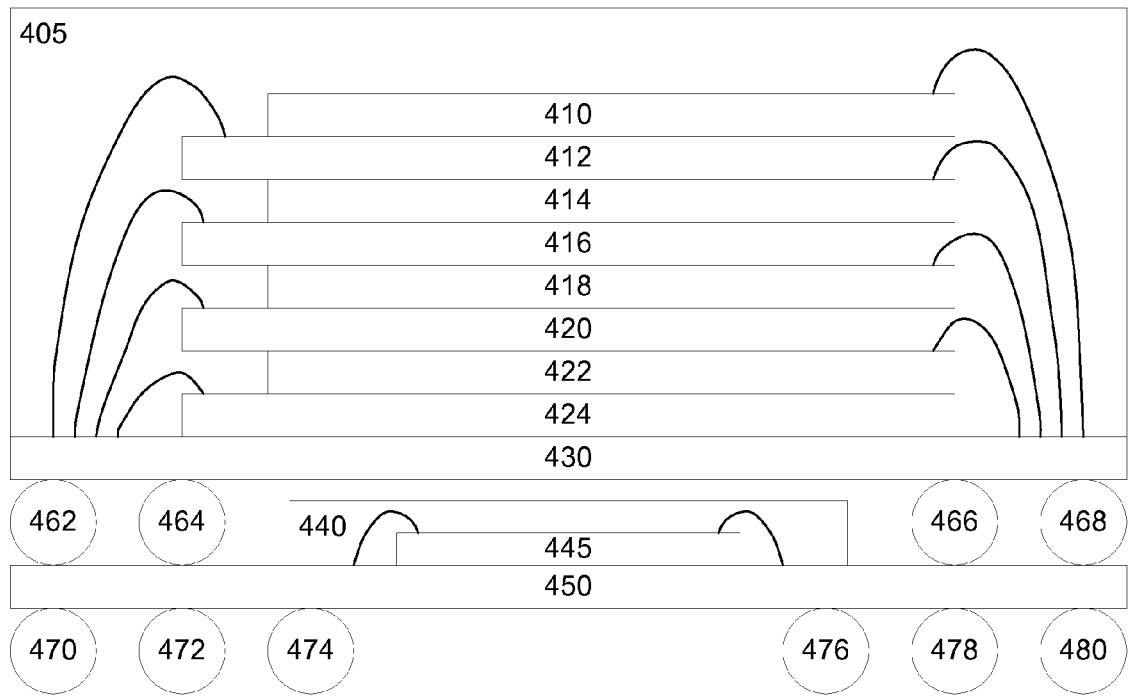
400          FIG. 4

METHOD AND SYSTEM TO ISOLATE MEMORY MODULES IN A SOLID STATE DRIVE

FIELD OF THE INVENTION

This invention relates to a solid state drive, and more specifically but not exclusively, to isolate memory modules in the solid state drive.

BACKGROUND DESCRIPTION

NAND flash memory modules are often used in a solid state drive. In each NAND flash memory module, typically more than one die is packaged in the NAND flash memory module. If any die in a particular NAND flash memory module is determined to be defective, the particular NAND flash memory module is discarded. This causes the good dies (if any) in the particular NAND flash memory module to be discarded as well even though they are functioning.

BRIEF DESCRIPTION OF THE DRAWINGS

The features and advantages of embodiments of the invention will become apparent from the following detailed description of the subject matter in which:

FIG. 1 illustrates a block diagram of a solid state drive in accordance with one embodiment of the invention;

FIG. 4 illustrates a package on package in accordance with one embodiment of the invention.

DETAILED DESCRIPTION

Figure 2:
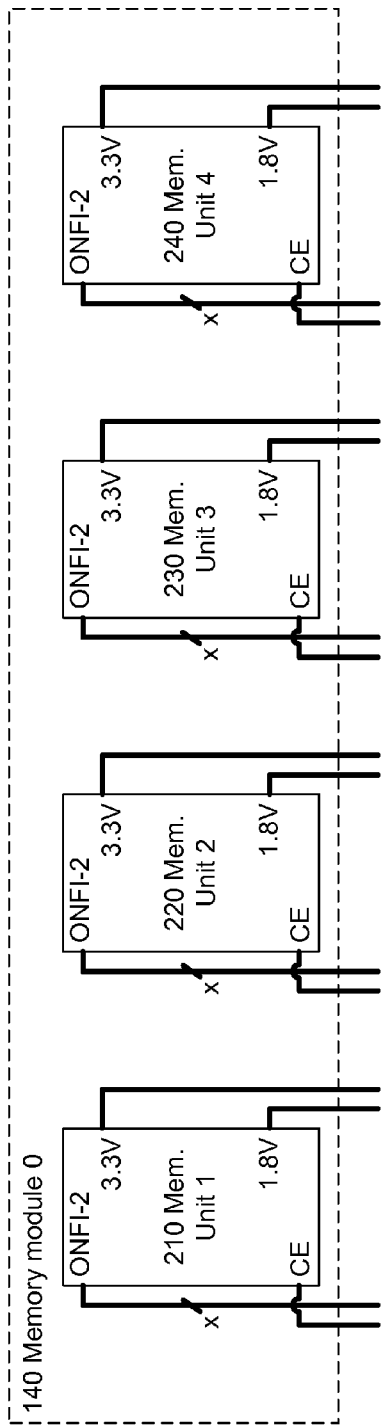
FIG. 2 illustrates an arrangement of the memory units in a memory module in accordance with one embodiment of the invention.

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

Embodiments of the invention provide a method and system to isolate memory modules in a solid state drive (SSD). In one embodiment of the invention, the SSD can facilitate the usage of memory modules that have one or more defective or disabled memory units. By doing so, memory modules with one or more defective units do not have to be discarded and the good unit(s) in the memory modules can be utilized. Therefore, the overall cost of the SSD can be improved as the effective yield of the memory modules is increased.

For example, in one embodiment of the invention, a single memory module has eight memory units or dies. In one embodiment of the invention, each memory module is not discarded even if there are one or more defective dies in each memory module. Assuming a SSD requires sixty-four good or working memory units, the requirement of the SSD can be fulfilled with eight memory modules with eight good memory units (8×8=64). The requirement of the SSD can also be fulfilled with six memory modules with eight good memory units and three memory modules with six good memory units [(6×8)+(3×6)=66] in one embodiment of the invention. Each of the three memory modules with six good memory units has two defective memory units. In one embodiment of the invention, the SSD has logic to isolate the two defective memory units in the three memory modules.

In another embodiment of the invention, the SSD has logic to isolate good or working units that are not required. For example, assuming that a SSD requires exactly sixty-four good memory units, the requirement can be fulfilled with a configuration of six memory modules with eight good memory units and three memory modules with six good memory units, i.e., a total of sixty-six good memory units. However, since the total number of good memory units in the configuration exceeds the requirement of the SSD, the SSD disables two of the sixty-six good memory units in order to fulfill its requirement. In another embodiment of the invention, the SSD is able to accommodate more good memory units without the need to disable additional good memory units.

Embodiments of the invention facilitate the usage of memory modules that have one or more defective memory units or dies. In one embodiment of the invention, a memory module is packaged with a number of dies and the memory module is tested and sorted according to the number of dies that pass testing, i.e., working dies. Each signal of each die in the memory module has an unique bond-out or connection point in the package of the memory module. The signal of each die includes, but is not limited to, a communication signal, a power signal and the like. By separating the signals of each die in the memory module, any defective die can be easily isolated in one embodiment of the invention. This allows a significant cost reduction in products that use a large number of dies.

FIG. 1 illustrates a block diagram 100 of a solid state drive 102 in accordance with one embodiment of the invention. The SSD 102 has a controller 130, a host interface module 110, a buffer 120, and memory module 0 140, memory module 1 142, memory module 2 144, and memory module 3 146. In one embodiment of the invention, the host interface module 110 provides an interface to connect with a host device or system. The host interface module 110 operates in accordance with a communication protocol, including but not limited to, Serial Advanced Technology Attachment (SATA) Revision 1.x, SATA Revision 2.x, SATA Revision 3.x, and any other type of communication protocol.

The buffer 120 provides temporary storage to the SSD 102 in one embodiment of the invention. The buffer includes Synchronous Dynamic Random Access Memory (SDRAM), Dynamic Random Access Memory (DRAM), RAMBUS Dynamic Random Access Memory (RDRAM), and/or any other type of random access memory device.

Each of the memory modules 0-3 140, 142, 144, and 146 has a number of memory units. For example, in one embodiment of the invention, each of memory modules 0-3 140, 142, 144, and 146 has sixteen memory units. Each memory unit in each of the memory modules 0-3 140, 142, 144, and 146 has communication signals that are individually connected to the controller 130. In one embodiment of the invention, the memory modules 0-3 140, 142, 144, and 146 include, but are not limited to, NAND flash memories, and the like.

The controller 130 has logic to facilitate isolation of one or more memory units in each of the memory modules 0-3 140, 142, 144, and 146 in one embodiment of the invention. The controller 130 uses switching logic to isolate the memory units in one embodiment of the invention. In one embodiment of the invention, the controller 130 isolates defective memory units. In another embodiment of the invention, the controller 130 isolates memory units that are not required. In yet another embodiment of the invention, the controller 130 isolates both defective memory units and memory units that are not required. The number of memory modules shown in FIG. 1 is not meant to be limiting and any other variation in the memory configuration can be used without affecting the workings of the invention.

FIG. 2 illustrates an arrangement 200 of the memory units in a memory module 0 140 in accordance with one embodiment of the invention. For clarity of illustration, FIG. 2 is discussed with reference to FIG. 1. The memory module 0 140 has memory unit 1 210, memory unit 2 220, memory unit 3 230 and memory unit 4 240.

In one embodiment of the invention, the memory units 1-4 210, 220, 230, and 240 are compliant with the Open NAND Flash Interface (ONFI) specification (ONFI, "Open NAND Flash Interface Specification", Rev 2.2, October 2009). In another embodiment of the invention, the memory units 1-4 210, 220, 230, and 240 are compliant with, but not limited to, earlier and future versions of the ONFI specification, and any other memory interface specification.

Each memory unit has ONFI-2 communication signals, a chip enable (CE) signal, and two power signals of 3.3 volts (V) and 1.8V. In one embodiment of the invention, the ONFI-2 communication signals, the CE signal, and the two power signals of 3.3 V and 1.8V of each memory unit have an unique connection point as illustrated in FIG. 2. This allows any one of the memory units 1-4 210, 220, 230, and 240 to be isolated if they are defective or not required. In one embodiment of the invention, the power signals of 3.3V and 1.8V of each defective or unnecessary memory unit are shorted or connected to ground voltage. By doing so, the defective or unnecessary memory unit(s) are powered off.

For example, in one embodiment of the invention, assuming that memory unit 1 210, memory unit 2 220, and memory unit 4 240 are determined to be good, i.e., working units, and the memory unit 3 230 is determined to be defective, the power signals of 3.3V and 1.8V of the memory unit 3 230 are shorted to ground voltage. Since the power signals of the memory unit 3 230 are not connected to the other memory units, the memory unit 3 230 can be easily disabled without affecting the operations of the other working memory units.

In another embodiment of the invention, the controller disables defective memory units by using a switch to bypass the communication signals or chip enable signal of the defective memory unit. One of ordinary skill in the relevant art will readily appreciate that other methods of isolating the defective memory unit(s) can be used without affecting the workings of the invention. For example, resistors are used in another embodiment of the invention to isolate the defective memory unit.

The configuration of the memory units 1-4 210, 220, 230, and 240 in the memory module 0 140 is not meant to be limiting. In other embodiments of the invention, a different configuration of the number of memory units can be used without affecting the workings of the invention. In one embodiment of the invention, the memory module 1 142, memory module 2 144, and memory module 3 146 have the same configuration as memory module 0 140 in one embodiment of the invention. In other embodiments of the invention, all the memory modules 0-3 140, 142, 144, and 146 have a different configuration of memory units.

Figure 3:
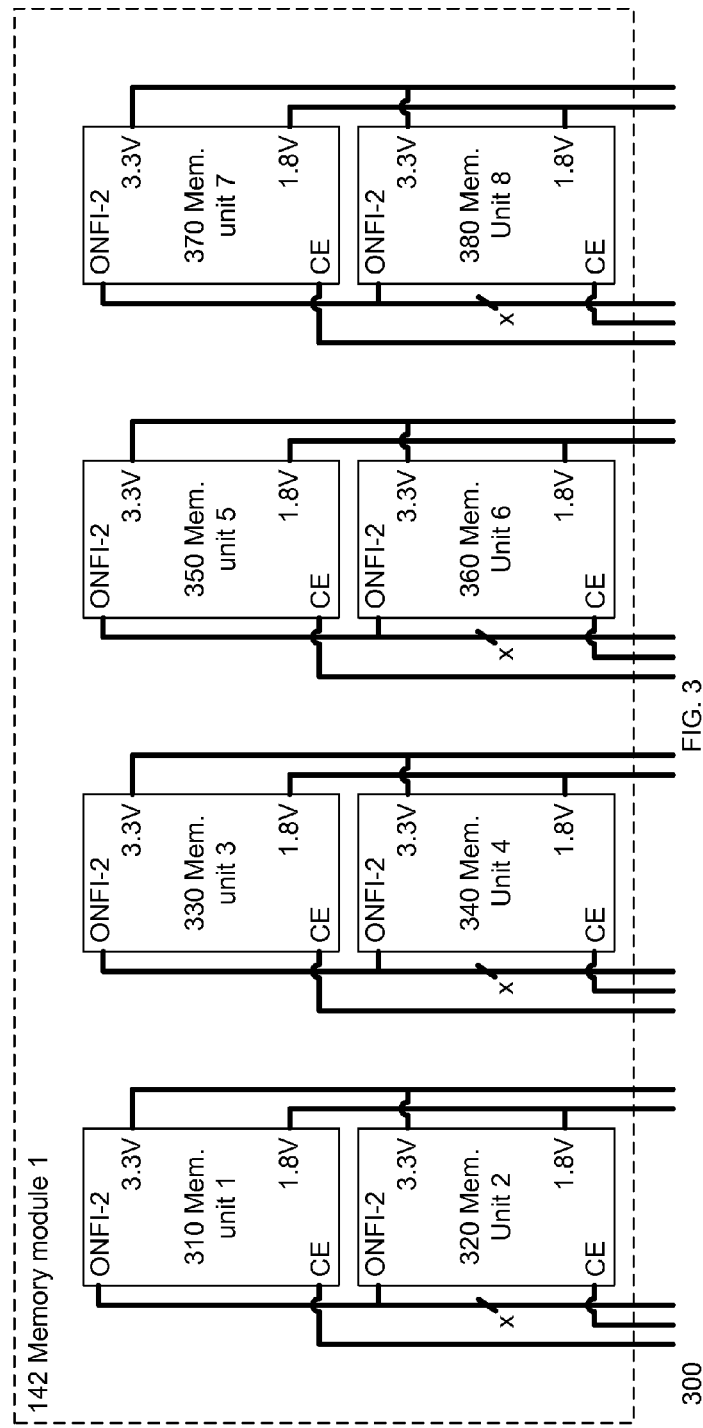
FIG. 3 illustrates an arrangement of the memory units in a memory module in accordance with one embodiment of the invention.

FIG. 3 illustrates an arrangement 300 of the memory units in a memory module 1 142 in accordance with one embodiment of the invention. For clarity of illustration, FIG. 3 is discussed with reference to FIGS. 1 and 2. The memory module 1 142 has memory unit 1 310, memory unit 2 320, memory unit 3 330, memory unit 4 340, memory unit 5 350, memory unit 6 360, memory unit 7 370, and memory unit 8 380. In one embodiment of the invention, the memory units 1-8 310, 320, 330, 340, 350, 360, 370 and 380 are compliant with the ONFI specification.

The memory units 1-8 310, 320, 330, 340, 350, 360, 370 and 380 in the memory module 1 142 are similar to the memory units 1-4 210, 220, 230, and 240 in the memory module 0 140. In one embodiment of the invention, the communication signals of memory unit 1 310 and memory unit 2 320 share a common bus and the power signals of 3.3V and 1.8V of memory unit 1 310 and memory unit 2 320 are connected together. The memory unit 3 330 and memory unit 4 340, the memory unit 5 350 and memory unit 6 360, and the memory unit 7 370 and memory unit 8 380 are connected together in a similar manner as memory unit 1 310 and memory unit 2 320 and shall not repeated herein.

The arrangement 300 allows more memory units to be packaged in the memory module 1 142. In one embodiment of the invention, a particular memory unit in the memory module 1 142 is isolated by shorting the power signals (3.3V and 1.8V) of the particular memory unit. For example, in one embodiment of the invention, memory unit 2 320 is determined to be defective. The power lines (3.3V and 1.8V) of the memory unit 1 310 and memory unit 1 310 are connected together and are shorted to ground voltage to isolate memory unit 2 320. The memory unit 1 310 may be a working die and it is sacrificed in order to isolate memory unit 2 320 in one embodiment of the invention.

In another embodiment of the invention, a particular memory unit in the memory module 1 142 is isolated by disabling the chip enable signal of the particular memory unit. In yet another embodiment of the invention, the memory module 1 142 is connected with the controller 130 that has switching logic to isolate the communication signals of a defective memory unit. One of ordinary skill in the relevant art will readily appreciate that other methods of isolating the defective memory unit(s) can be used without affecting the workings of the invention The configuration of the memory units 1-8 310, 320, 330, 340, 350, 360, 370 and 380 in the memory module 1 142 is not meant to be limiting. In other embodiments of the invention, a different configuration of the number of memory units can be used without affecting the workings of the invention. The memory module 0 140, memory module 2 144, and memory module 3 146 have the same configuration as memory module 1 142 in one embodiment of the invention. In other embodiments of the invention, the memory module 0 140, memory module 1 142, memory module 2 144, and memory module 3 146 have a different configuration of memory units.

FIG. 4 illustrates a package on package (PoP) 400 in accordance with one embodiment of the invention. The PoP 405 has two packages that are connected together. The first package is a memory module 405 and the second package is a controller module 440. The memory module 405 has eight memory dies that are stacked on top of each other as illustrated by the elements 410, 412, 414, 416, 418, 420, 422, and 424. The memory dies 410, 412, 414, 416, 418, 420, 422, and 424 are wire bonded to a substrate 430.

The controller module 440 has a controller 445 that is wire bonded to a substrate 450. The substrate 430 and 450 are connected via the bumps 462, 464, 466, and 468. The PoP 400 can be connected to other components or boards via the bumps 470, 472, 474, 476, 478, and 480. To isolate a particular die in the memory module 405, the power signals of the particular die are shorted to a ground line in the substrate 430 in one embodiment of the invention.

The PoP 400 illustrates one embodiment of the connection between the memory module 405 and the controller module 440 and is not meant to be limiting. One of ordinary skill in the relevant will readily appreciate that other methods of connecting the memory module 405 and the controller module 440 can be used without affecting the workings of the invention.

Figure 5:
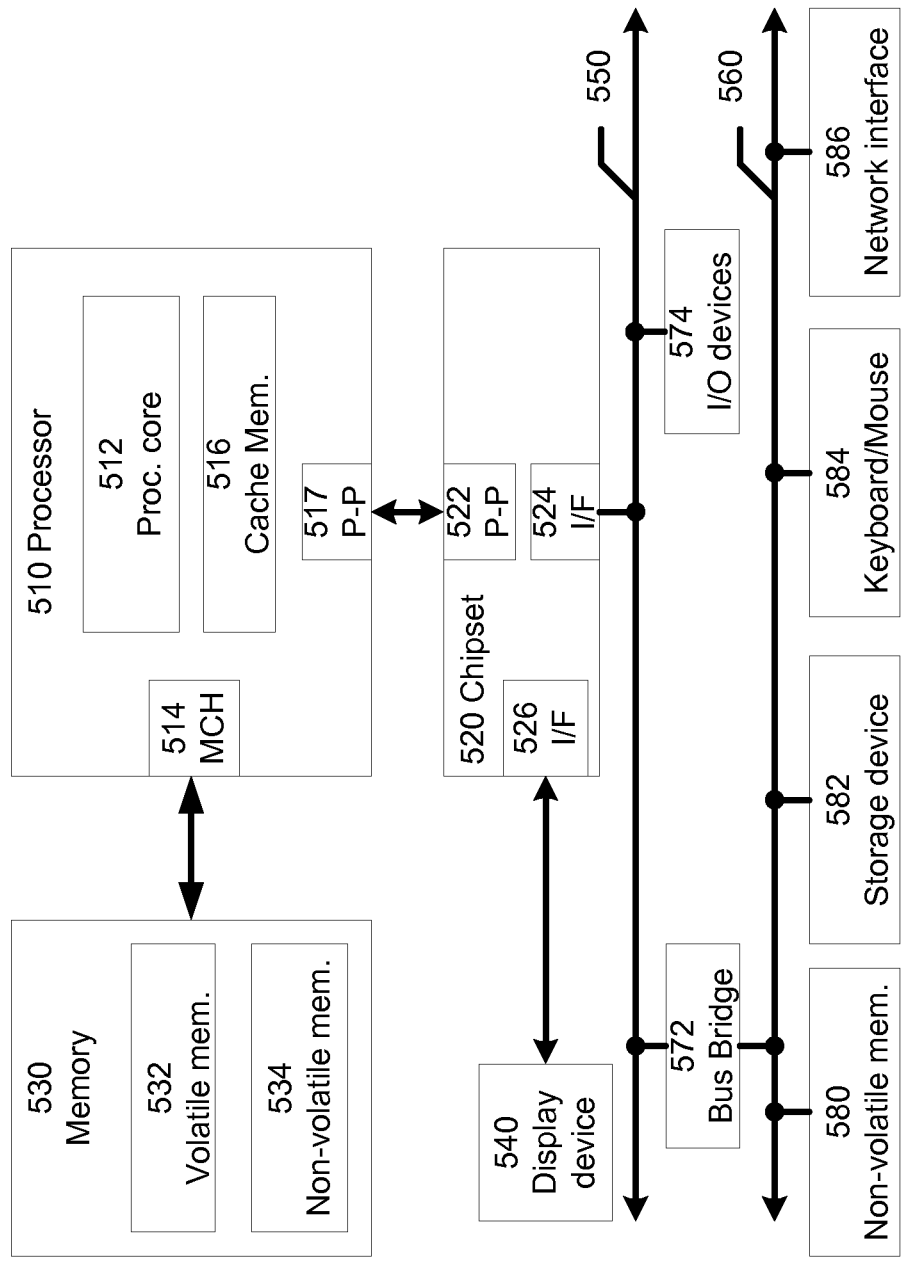
FIG. 5 illustrates a system to implement the methods disclosed herein in accordance with one embodiment of the invention.

FIG. 5 illustrates a system 500 to implement the methods disclosed herein in accordance with one embodiment of the invention. The system 500 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 500 used to implement the methods disclosed herein may be a system on a chip (SOC) system.

The processor 510 has a processing core 512 to execute instructions of the system 500. The processing core 512 includes, but is not limited to, pre-fetch logic to fetch instructions, decode logic to decode the instructions, execution logic to execute instructions and the like. The processor 510 has a cache memory 516 to cache instructions and/or data of the system 500. In another embodiment of the invention, the cache memory 516 includes, but is not limited to, level one, level two and level three, cache memory or any other configuration of the cache memory within the processor 510.

The memory control hub (MCH) 514 performs functions that enable the processor 510 to access and communicate with a memory 530 that includes a volatile memory 532 and/or a non-volatile memory 534. The volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 534 includes, but is not limited to, NAND flash memory, phase change memory (PCM), read only memory (ROM), electrically erasable programmable read only memory (EEPROM), or any other type of non-volatile memory device.

The memory 530 stores information and instructions to be executed by the processor 510. The memory 530 may also stores temporary variables or other intermediate information while the processor 510 is executing instructions. The chipset 520 connects with the processor 510 via Point-to-Point (PtP) interfaces 517 and 522. The chipset 520 enables the processor 510 to connect to other modules in the system 500. In one embodiment of the invention, the interfaces 517 and 522 operate in accordance with a PtP communication protocol such as the Intel® QuickPath Interconnect (QPI) or the like.

The chipset 520 connects to a display device 540 that includes, but is not limited to, liquid crystal display (LCD), cathode ray tube (CRT) display, or any other form of visual display device. In one embodiment of the invention, the processor 510 and the chipset 520 are merged into a SOC. In addition, the chipset 520 connects to one or more buses 550 and 555 that interconnect the various modules 574, 560, 562, 564, and 566. Buses 550 and 555 may be interconnected together via a bus bridge 572 if there is a mismatch in bus speed or communication protocol. The chipset 520 couples with, but is not limited to, a non-volatile memory 560, a storage device(s) 562, a keyboard/mouse 564 and a network interface 566.

The storage device 562 includes, but is not limited to, a solid state drive, a hard disk drive, an universal serial bus flash memory drive, or any other form of computer data storage medium. The network interface 566 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although the cache memory 516 is depicted as a separate block within the processor 510, the cache memory 516 can be incorporated into the processor core 512 respectively. The system 500 may include more than one processor/processing core in another embodiment of the invention.

The methods disclosed herein can be implemented in hardware, software, firmware, or any other combination thereof. Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. An apparatus comprising:
a flash memory module having a plurality of NAND flash memory units, each NAND flash memory unit having one or more power lines, wherein each power line of each NAND flash memory unit has an unique bonding point in the flash memory module to allow any one of the NAND flash memory units to be isolated at their unique bonding point by shorting the one or more power lines of the unique bonding point to a ground voltage while other of the NAND flash memory units are operable as working NAND flash memory units in the flash memory module.

2. The apparatus of claim 1, wherein each NAND flash memory unit further comprises one or more communication signals, and wherein each communication signal of each NAND flash memory unit provides the unique bonding point in the flash memory module for the NAND flash memory unit.

3. The apparatus of claim 2, wherein one or more of the plurality of NAND flash memory units are to be disabled.

4. The apparatus of claim 3, wherein each of the one or more NAND flash memory units to be disabled comprises an enabling signal, the enabling signal to activate or deactivate the one or more communication signals, and wherein the enabling signal is to be deactivated.

5. The apparatus of claim 2, wherein the one or more communication signals of each NAND flash memory unit are to operate in accordance with Open NAND Flash Interface (ONFI).

6. The apparatus of claim 2, wherein at least two of the NAND flash memory units share common power lines, and wherein shorting the common power lines isolates the at least two NAND flash memory units sharing the common power lines.

7. An apparatus comprising:
a flash memory device having one or more memory modules, each memory module comprising a plurality of NAND flash memory dies, wherein at least one of the one or more memory modules comprises at least one NAND flash memory die, each NAND flash memory die having an unique bonding point in the memory module to allow any one of the NAND flash memory dies to be isolated at their unique bonding point by shorting the one or more power lines of the unique bonding point to a ground voltage while other of the NAND flash memory units are operable as working NAND flash memory units in the memory module.

8. The apparatus of claim 7, wherein each NAND flash memory die comprises one or more communication signals and one or more power domains, and wherein each communication signal and each power domain of each NAND flash memory die are to have a separate connection point in each memory module.

9. The apparatus of claim 8, further comprising:
a controller, coupled with the one or more memory modules via the one or more communication signals of each NAND flash memory die, to deactivate one of the one or more communication signals of the at least one NAND flash memory die that is to be disabled, wherein the one communication signal is to enable or disable all of the one or more communication signals.

10. The apparatus of claim 7, wherein the plurality of NAND flash memory dies are to operate in accordance with Open NAND Flash Interface (ONFI).

11. The apparatus of claim 7, wherein at least two of the NAND flash memory dies share common power lines, and wherein shorting the common power lines isolates the at least two NAND flash memory dies sharing the common power lines.

* * * * *